United States Patent [19]

Sugawara

[11] Patent Number: 5,438,280
[45] Date of Patent: Aug. 1, 1995

[54] INPUT CIRCUIT RECEIVING INPUT SIGNAL OF TTL LEVEL

[75] Inventor: Mitsutoshi Sugawara, Tokyo, Japan

[73] Assignee: NEC Corporation, Tokyo, Japan

[21] Appl. No.: 159,512

[22] Filed: Nov. 30, 1993

[30] Foreign Application Priority Data

Dec. 1, 1992 [JP] Japan .................. 4-321743

[51] Int. Cl.⁶ .................. H03K 19/0175
[52] U.S. Cl. .................. 326/71; 326/33; 327/143
[58] Field of Search ............ 307/451, 475, 443, 362; 326/71, 81, 121, 33; 327/77, 143

[56] References Cited

U.S. PATENT DOCUMENTS

| | | | |
|---|---|---|---|
| 4,763,022 | 8/1988 | Sheldon | 307/475 |
| 4,929,853 | 5/1990 | Kim et al. | 307/475 |
| 4,999,529 | 3/1991 | Morgan, Jr. et al. | 307/475 |
| 5,304,872 | 4/1994 | Avraham et al. | 307/475 |
| 5,341,045 | 8/1994 | Almulla | 307/475 |

*Primary Examiner*—David R. Hudspeth
*Assistant Examiner*—Stephen Calogero
*Attorney, Agent, or Firm*—Young & Thompson

[57] ABSTRACT

A signal input circuit having a CMOS inverter for receiving an input signal of a TTL level is disclosed. This circuit includes a first transistor of one channel type connected between a first power terminal and an output terminal and having a gate connected to an input terminal, a second transistor of an opposite channel type connected between a second power terminal and the output terminal and having a gate connected to the input terminal, and a current gain control circuit coupled to the first transistor for controlling the current gain of the first transistor to a first value when a power voltage is at a first level and to a second value when the power voltage is at a second level.

8 Claims, 3 Drawing Sheets

INPUT CIRCUIT RECEIVING INPUT SIGNAL OF TTL LEVEL

BACKGROUND OF THE INVENTION

The present invention relates to a signal input circuit and, more particularly, to such a circuit having a CMOS inverter for receiving an input signal of g Transistor-Transistor-Logic (TTL) level.

As a signal input circuit, a CMOS inverter is usually employed in a logic circuit. The CMOS inverter has such a circuit construction as shown in FIG. 6, wherein a P-channel MOS transistor Q1 and an N-channel MOS transistor Q2 are connected in series between first and second power supply terminals 3 and 4. The first power supply terminal 3 is applied with a power voltage of a VDD level and the second terminal 4 is applied with the ground level (GND). The gates of the transistors Q1 and Q2 are connected in common to an input terminal 1 and the connection point thereof is lead out as an output terminal 2.

When the input signal applied to the terminal 1 takes such a level that is equal to a logical threshold level of the inverter, the same current flows through both of the transistors Q1 and Q2, and each of them thus operates in a saturated region. Accordingly, the following equation (1) is derived:

$$\frac{BN \cdot (VINV - VTN)^2}{2} = \frac{BP \cdot (VDD - VINV - |VTP|)^2}{2} \quad (1)$$

wherein BP and BN indicate the current gains of the transistors Q1 and Q2, respectively, VTP and VTN indicating the threshold voltages thereof, respectively, VINV indicating the logical threshold level of the inverter, and VDD indicates the power voltage between the terminals 3 and 4. The equation (1) is rewritten as follows:

$$\frac{BN}{BP} = \left( \frac{VDD - VINV - |VTP|}{VINV - VTN} \right)^2 \quad (2)$$

Considering here that the CMOS inverter shown in FIG. 6 is used for an input circuit receiving a signal of the TTL level, this signal has an amplitude between 0.8 V to 2.0 V and therefore the threshold level VINV of the inverter is required to be designed to an intermediate level of the amplitude of the signal. Typically, the threshold level is designed to be 1.4 V. Assuming here that the power voltage VDD is 5 V, VINV = 1.4 V, and VTN=VTP=0.7 V, the following equation (3) is derived from the equation (2)

$$BN/BP = 17.14 \quad (3)$$

Thus, by designing the current gains of the transistors Q1 and Q2 to satisfy the equation (3), the CMOS inverter shown in FIG. 6 operates as an input signal circuit for receiving a signal of the TTL level. Since the current gain of a MOS transistor is proportional to the gate width and is inversely proportional to the gate length, the ratio in current gain between the transistors Q1 and Q2 indicated above can be obtained from the gate width and/or length thereof. For example, the ratio of the gate width to the gate length of the transistor Q2 is designed about 17 times as large as the ratio of the gate width to the gate length of the transistor Q1.

Recently, due to a demand for low power voltage, the power supply voltage applied to the logic circuit has been decreased from 5 V to 3 V. That is, the logic circuit is required to operate on not only the 5 V power voltage but 3 V power voltage. However, the CMOS inverter composed of the transistors Q1 and Q2 having the respective current gains designed above hardly has a TTL comparative characteristics when the power voltage is lowered to 3 V.

More particularly, solving the equation (1) for the threshold voltage VINV, the following equation (4) is obtained:

$$VINV=(VDD-|VTP|+mVTN)/(1+m) \quad (4)$$

wherein $m=\sqrt{BN/BP}$.

Since VDD=3 V and BN/BP=17.14, the threshold voltage VINV becomes equal to 1.01 V. This threshold voltage exists within the amplitude of the TTL level signal, and hence the CMOS inveRter can receive the TTL level signal to produce a logic high or low level output signal in accordance therewith. However, if the threshold voltage of the transistor Q2 is changed to 0.4 V due to the temperature variation and/or manufacturing conditions, the logical threshold level of the inverter is changed to 0.77 V. The output signal from the inverter is thereby held at the low level irrespective of the level of the input signal.

SUMMARY OF THE INVENTION

It is therefore an object of the present invention to provide an improved signal input circuit receiving a TTL level signal.

It is another object of the present invention to provide a signal input circuit which outputs the logic high or low level in accordance with a TTL level input signal even when a power voltage is changed.

An input circuit according to the present invention comprises a first transistor of one channel type connected between a first power terminal and an output terminal and having a gate connected to an input terminal, a second transistor of an opposite channel type connected between a second power terminal and the output terminal and having a gate connected to the input terminal, and a current gain control circuit coupled to the first transistor and controls a current gain of the first transistor to a first value when a power voltage between the first and second power terminals is higher than a predetermined value and to a second value that is different from the first value when the power voltage is lower than the predetermined value.

Thus, the current gain of the transistor is dependent on the value of the power voltage, not constant. The threshold level of the circuit is thereby changed in accordance with the level of the power voltage to produce the output signal taking the logic high or low level relative to the input signal even when the power voltage is changed.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

Figure 1:
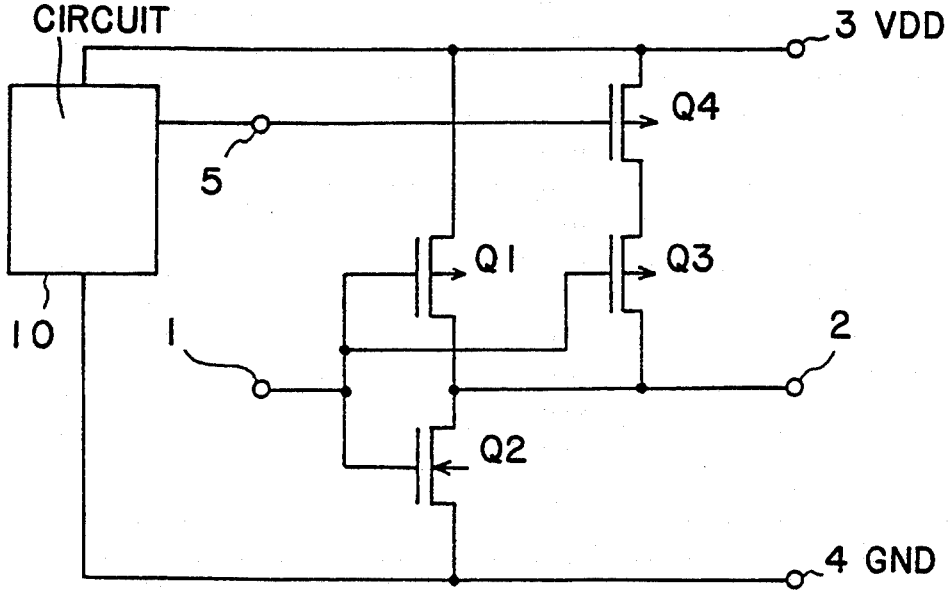
FIG. 1 is a circuit diagram illustrative of an input circuit according to a first embodiment of the present invention.
Figure 6:
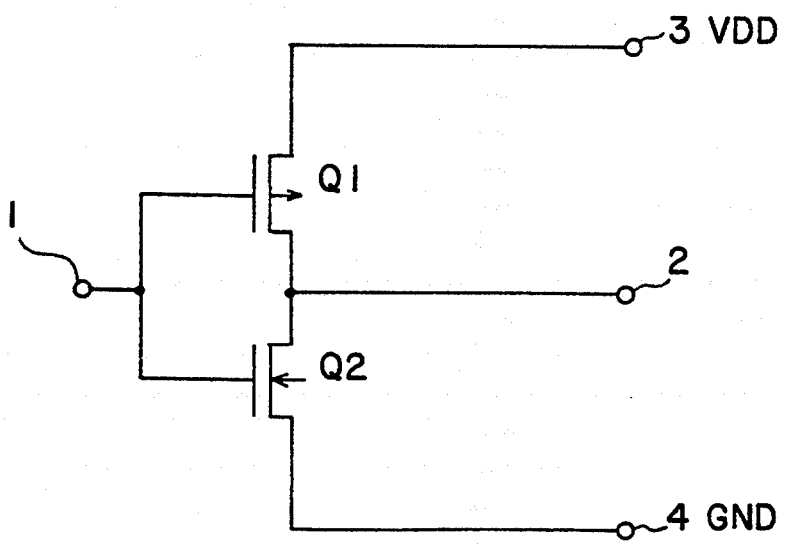
FIG. 6 is a circuit diagram illustrative of an input circuit according to the prior art.

Referring to FIG. 1, an input circuit according to a first embodiment of the present invention further includes, in addition to the circuit constituents shown in FIG. 6, a series circuit composed of P-channel MOS transistors Q3 and Q4 and connected in parallel to the transistor Q1 between the power terminal 3 and the output terminal 2. The gate of the transistor Q3 is connected to the input terminal 1 and the gate of the transistor Q4 is connected to a control terminal 5. Connected in turn to the terminal 5 is a power voltage detection circuit 10.

Figure 3:
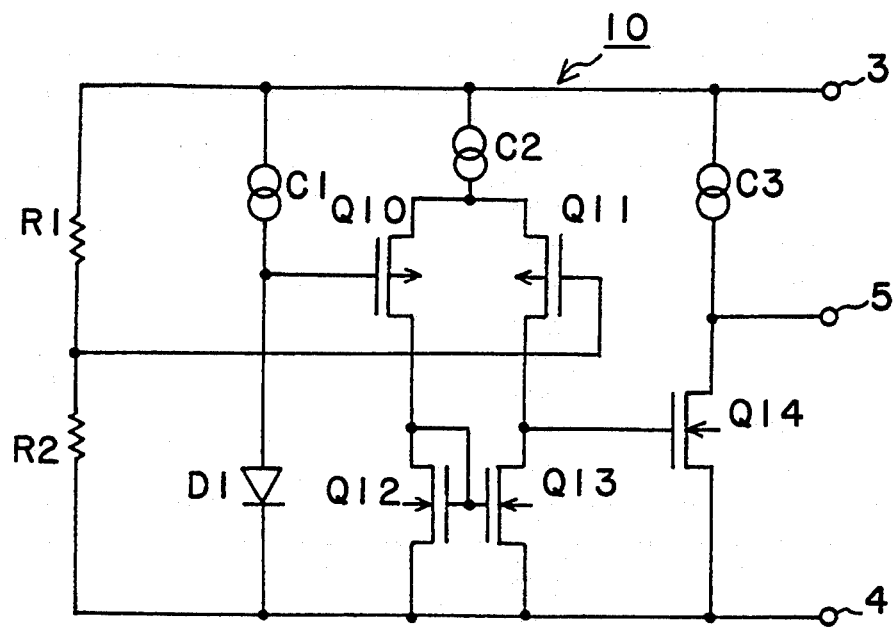
FIG. 3 is a circuit diagram indicative of a power voltage detection circuit shown in FIG. 1.

Referring to FIG. 3, the detection circuit 10 includes two resistors R1 and R2, a diode D1, three current sources C1-C3, two P-channel MOS transistors Q10 and Q11 and three N-channel MOS transistors Q12-Q14 which are connected as shown. When the power voltage between the terminals 3 and 4 is 5 V, the resistor-divided voltage by the resistors R1 and R2 is higher than the forward voltage drop of the diode D1, so that the terminal 5 takes the high level (5 V). On the other hand, the power voltage of 3 V causes the resistor-divided voltage to become lower than the forward voltage of the diode D1. The terminal 5 is thereby changed to the low level (GND level). Thus, the logic level at the control terminal 5 takes either high or low level in accordance with the level of the power voltage. If desired, the so-called band-gap regulator can be used in place of the diode D1.

Turning back to FIG. 1, When the power voltage VDD is at 5 V, the control terminal 5 takes the high level, so than the transistor Q4 is rendered nonconductive. Substantially no current flows through the transistor Q3. The transistor Q3 is thereby disconnected from the circuit and only the transistors Q1 and Q2 responds to the input signal. This is equivalent to the circuit shown in FIG. 6. The ratio in current gain between the transistors Q1 and Q2 is designed to satisfy the equation (3). The output signal from the output terminal 2 takes the logic high or low level in accordance with the level of the input TTL level signal, as mentioned hereinbefore.

When the power voltage of 3 V is applied between the power terminals 3 and 4, on the other hand, the control terminal 5 is changed to the low level. The transistor Q4 is thereby turned ON. The current gain of the transistor Q4 is designed to be sufficiently large as compared to that of the transistor Q3, and hence the source of the transistor Q3 is equivalently connected directly to the power terminal 3. That is, the transistor Q3 is connected in parallel to the transistor Q1. Assuming that the current gain of the transistor Q1 is represented by unity, i.e. 1, the current gain of the transistor Q3 is designed to be 9.3. Accordingly, the total current gain composed of the parallel connection of the transistors Q1 and Q3 becomes to be 10.3. The current gain of the transistor Q2 is designed to be 17, on the other hand. Accordingly, BN/BP=1.65. This ratio in current gain causes the logical threshold voltage VINV of the circuit. shown in FIG. 1 to become a center level of the amplitude of the TTL level. That is, the threshold voltage VINV of the circuit takes the value of 1.4 V in both 5 V and 3 V power voltage.

Figure 2:
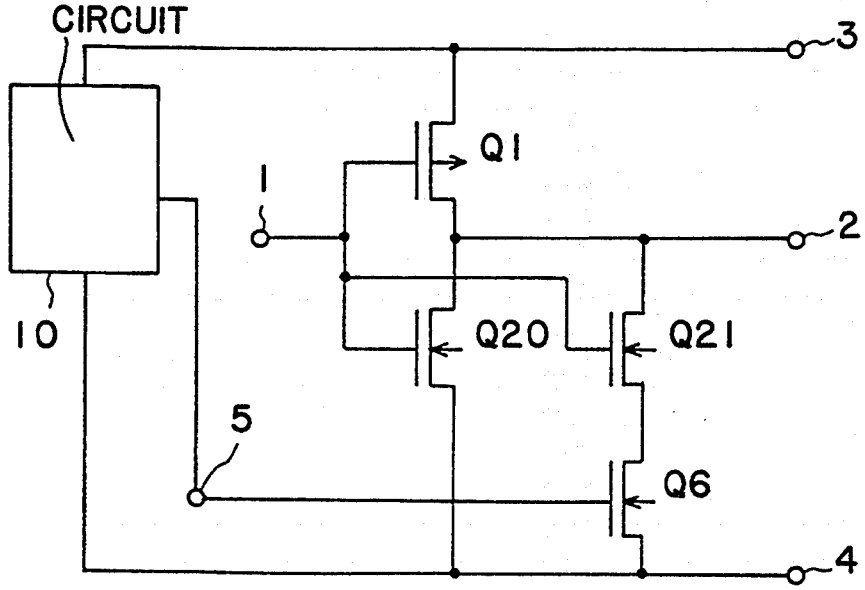
FIG. 2 is a circuit diagram illustrative of a second embodiment of the present invention.

Turning to FIG. 2, in this circuit according to a second embodiment of the present invention, three N-channel MOS transistors Q20, Q21 and Q6 are provided in place of the transistor Q2 of FIG. 1. The current gains of the transistors Q20 and Q21 are designed to be 1.65 and 15.35, respectively, and the current gain of the transistor Q6 is sufficiently larger than that of the transistor Q21. When the power voltage is 5 V, therefore, the transistor Q6 is rendered conductive, so that the total current gain composed of the parallel connection of the transistors Q20 and Q21 becomes to be 17. When the 3 V power voltage is applied, the transistor Q6 is made nonconductive to change the total current gain to 1.65. The same circuit operation and effects as that shown in FIG. 1 are derived.

Figure 4:
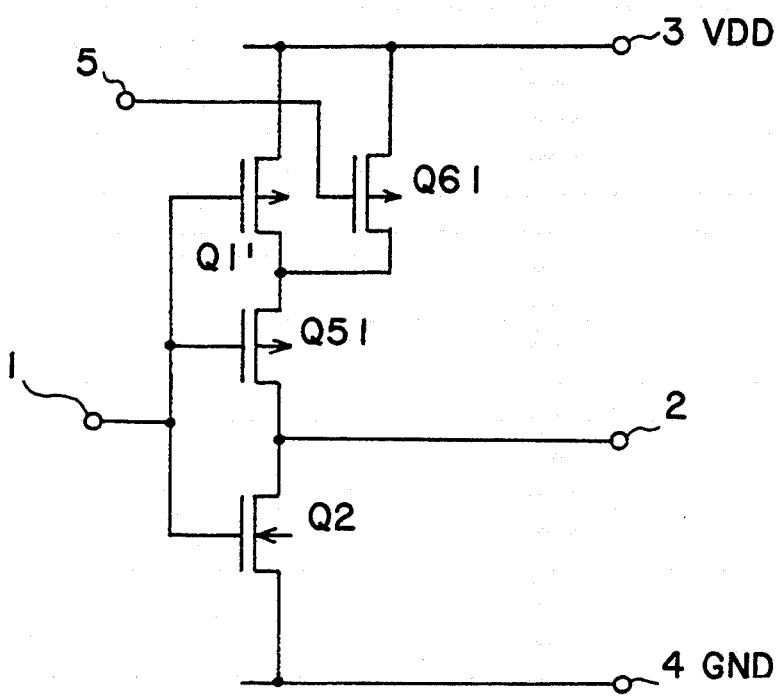
FIG. 4 is a circuit diagram illustrative of a third embodiment of the present invention.

Referring to FIG. 4, this signal input circuit according to a third embodiment of the present invention includes P-channel MOS transistors Q1' and Q51 connected in series between the power terminal 3 and the output terminal 2 and a P-channel MOS transistor Q61 connected in parallel to the transistor Q1'. The gate of the transistor Q61 is connected to the control terminal 5 which is supplied with the power voltage detection signal from the detection circuit shown in FIG. 1. The current gain of the transistors Q1' and Q51 are designed to be 1.1 and 10.3, respectively and the current gain of the transistor Q61 is sufficiently larger than those of the transistors Q1' and Q51.

When the power voltage VDD is 3 V, the control terminal 5 takes the low level to turn the transistor Q61 ON. Accordingly, the source of the transistor Q51 is equivalently connected directly to the power terminal 3. As a result, BN/BP=17/10.3=1.65. The logical threshold voltage VINV becomes the center level of the TTL input signal under the power voltage of 3 V.

On the other hand, when the power voltage VDD is 5 V, the control terminal 5 is changed to the high level to turn the transistor Q61 OFF. The total current gain of the series connection of the transistors Q1' and Q51 becomes about 1. Thus, the logical threshold voltage VINV takes the center level of the TTL input signal also under the power voltage of 5 V.

Figure 5:
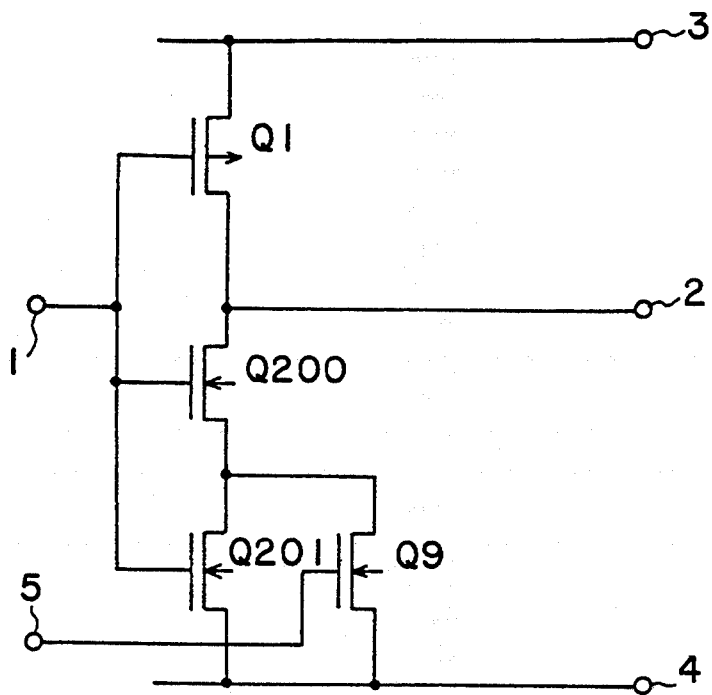
FIG. 5 is a circuit diagram illustrative of a fourth embodiment of the present invention.

Turning to FIG. 5, in this circuit according to a fourth embodiment of the present invention, two N-channel MOS transistors Q200 and Q201 are connected in series between the output terminal 2 and the ground terminal 4. There is further provide an N-channel MOS transistor Q9 connected in parallel to the transistor Q201 and having a gate connected to the control terminal 5. The current gains of the transistors Q200 and Q201 are designed to be 17 and 1.8, respectively, and the current gain of the transistor Q9 is much larger than that of the transistors Q201.

When the control terminal 5 assumes the high level indicative of the 5 V power voltage, the transistor Q9 is made conductive, so that the source of the transistor Q200 is equivalently connected directly to the ground terminal 4. Accordingly, the ratio in current gain of the N-channel MOS transistor to the P-channel MOS transistor is 17. On the other hand, when the power voltage of 3 V is applied, the control terminal is changed to the low level to turn the transistor Q9 OFF. As a result, the total current gain of the series connection of the transistors Q200 and Q201 is changed to 1.65. Thus, the logical threshold voltage VINV of the circuit also takes the center level of the TTL input signal under either 5 V or 3 V power voltage.

It is apparent that the present invention is not limited to the above embodiments, but may be modified and changed without departing from the scope and spirit of the invention. For example, the control terminal 5 may be connected to either power terminal 3 or the ground terminal 4 through an electrical switch or a mechanical switch in accordance with a power voltage to be applied between the terminals 3 and 4.

What is claimed is:

1. An input circuit comprising a first transistor of one channel type connected between a first power terminal and an output terminal and having a gate connected to an input terminal, a second transistor of an opposite channel type connected between a second power terminal and said output terminal and having a gate connected to said input terminal, a third and a fourth transistor of said one channel type connected in series between said first power terminal and said output terminal, said third transistor having a gate connected to said input terminal, and means coupled to a gate of said fourth transistor for turning said fourth transistor ON when a power voltage between said first and second power terminals takes a first level and OFF when said power voltage takes a second level.

2. The circuit as claimed in claim 1, wherein said one channel type is a P-channel type and said opposite channel type is an N-channel type, said first level being smaller in absolute value than said second level.

3. The circuit as claimed in claim 1, wherein said one channel type is an N-channel type and Said opposite channel type is a P-channel type, said first level being larger in absolute value than said second level.

4. An input circuit comprising a first transistor one channel type connected between a first power terminal and an output terminal and having a gate connected to an input terminal, a second transistor of an opposite channel type connected between a second power terminal and said output terminal and having a gate connected to said input terminal, a third transistor of said one channel type inserted in series to said first transistor between said first power terminal and said output terminal and having a gate connected to said input terminal, a fourth transistor of said one channel type connected in parallel to said third transistor, and means coupled to a gate of said fourth transistor for turning said fourth transistor ON when a power voltage between said first and second power terminals takes a first level and OFF when said power voltage takes a second level.

5. The circuit as claimed in claim 4, wherein said one channel type is a P-channel type and said opposite channel type is an N-channel type, said first level being smaller in absolute value than said second level.

6. The circuit as claimed in claim 4, wherein said one channel type is an N-channel type and said opposite channel type is a P-channel type, said first level being larger in absolute value than said second level.

7. An input circuit comprising a first transistor of one channel type connected between a first power terminal and an output terminal and having a gate connected to an input terminal, a second transistor of an opposite channel type connected between a second power terminal and said output terminal and having a gate connected to said input terminal, a third and a fourth transistors of said one channel type connected in series between said first power terminal and said output terminal, said third transistor being rendered conductive when a power voltage between said first and second power terminals takes a first level and nonconductive when said power voltage takes a second level different from said first level.

8. An input circuit comprising a first transistor of one channel type connected between a first power terminal and an output terminal and having a gate connected to an input terminal, a second transistor of an opposite channel type connected between a second power terminal and said output terminal and having a gate connected to said input terminal, a third transistor of said one channel type connected in series to said first transistor between said first power terminal and said output terminal, and a fourth transistor of said one channel type connected in parallel to said third transistor, said fourth transistor being rendered nonconductive when a power voltage between said first and second power terminals takes a first level and conductive when said power voltage takes a second level different from said first level.

* * * * *